(12) United States Patent
Yang et al.

(10) Patent No.: US 12,520,666 B2
(45) Date of Patent: Jan. 6, 2026

(54) DISPLAY SUBSTRATE AND DISPLAY DEVICE

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Zongshun Yang, Beijing (CN); Yunlong Li, Beijing (CN); Pengcheng Lu, Beijing (CN); Kuanta Huang, Beijing (CN); Dacheng Zhang, Beijing (CN); Yuhao Lee, Beijing (CN); Hongtao Yu, Beijing (CN); Hui Tong, Beijing (CN); Xiaobin Shen, Beijing (CN); Lingang Wen, Beijing (CN); Cao Wu, Beijing (CN); Shipeng Li, Beijing (CN); Jianming Zou, Beijing (CN); Chao Yang, Beijing (CN); Tao Sun, Beijing (CN); Xiong Tao, Beijing (CN); Yunchuan He, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 588 days.

(21) Appl. No.: 17/916,187

(22) PCT Filed: Oct. 21, 2021

(86) PCT No.: PCT/CN2021/125240
§ 371 (c)(1),
(2) Date: Sep. 30, 2022

(87) PCT Pub. No.: WO2023/065206
PCT Pub. Date: Apr. 27, 2023

(65) Prior Publication Data
US 2024/0215311 A1  Jun. 27, 2024

(51) Int. Cl.
*H10K 59/121* (2023.01)
*H10K 59/122* (2023.01)
*H10K 59/131* (2023.01)

(52) U.S. Cl.
CPC ....... *H10K 59/1213* (2023.02); *H10K 59/122* (2023.02); *H10K 59/131* (2023.02)

(58) Field of Classification Search
CPC ............. H10K 59/1213; H10K 59/122; H10K 59/131; H10K 59/00
(Continued)

(56) References Cited

U.S. PATENT DOCUMENTS 10,930,717 B2   2/2021   Chen
11,552,131 B2   1/2023   Huang et al.
(Continued)

FOREIGN PATENT DOCUMENTS

CN   107749419 A   3/2018
CN   109301092 A   2/2019
(Continued)

*Primary Examiner* — Huy Q Phan
(74) *Attorney, Agent, or Firm* — Dilworth & Barrese, LLP.; Michael J. Musella, Esq.

(57) ABSTRACT

A display substrate and a display device are provided, the display substrate includes a driving circuit substrate, a plurality of first electrodes and a pixel definition layer, and the driving circuit substrate includes a plurality of pixel driving circuits and a protective insulating layer. The plurality of first electrodes are respectively electrically connected to the output terminals of the plurality of pixel driving circuits through the plurality of first vias in the protective insulating layer, and each first electrode includes a first sub-electrode layer, a second sub-electrode layer and (Continued)

a transition layer. The first sub-electrode layer is electrically connected to the second sub-electrode layer through the first opening in the transition layer. An orthographic projection of a first opening of at least one first electrode on the driving circuit substrate is located inside an orthographic projection of the pixel definition layer on the driving circuit substrate.

20 Claims, 8 Drawing Sheets

(58) Field of Classification Search
USPC .......................................................... 257/40
See application file for complete search history.

(56) References Cited

U.S. PATENT DOCUMENTS

| | | |
|---|---|---|
| 11,569,476 B2 | 1/2023 | Long |
| 2004/0217697 A1 | 11/2004 | Lee et al. |
| 2008/0111484 A1 | 5/2008 | Kwon et al. |
| 2016/0071910 A1* | 3/2016 | Sasaki ................. H10K 59/351 |
| | | 257/89 |
| 2017/0278869 A1* | 9/2017 | Hiramatsu ........... H10D 86/441 |
| 2019/0267440 A1* | 8/2019 | Park .................... H10K 59/1213 |
| 2020/0090993 A1* | 3/2020 | Murray ............. H01L 21/76849 |
| 2021/0242297 A1* | 8/2021 | Yuan .................... H10K 59/131 |
| 2021/0273196 A1 | 9/2021 | Fang et al. |
| 2021/0288127 A1* | 9/2021 | In ......................... H10K 59/131 |
| 2021/0320157 A1 | 10/2021 | Xiao |
| 2022/0013610 A1* | 1/2022 | Li ...................... H10K 59/8051 |
| 2022/0190272 A1* | 6/2022 | Sun ..................... H10K 59/352 |

FOREIGN PATENT DOCUMENTS

| | | | | |
|---|---|---|---|---|
| CN | 208904069 U | 5/2019 | | |
| CN | 112820763 A | 5/2021 | | |
| CN | 112863332 A | 5/2021 | | |
| CN | 113013202 A | 6/2021 | | |
| EP | 2506326 A2 * | 10/2012 | ......... | H01L 27/1214 |

* cited by examiner

DISPLAY SUBSTRATE AND DISPLAY DEVICE

TECHNICAL FIELD

Embodiments of the present disclosure relate to a display substrate and a display device.

BACKGROUND

Silicon-based micro-display organic light-emitting display panels have advantages of miniaturization and high PPI (Pixel Per Inch), and have gradually become the focus of attention in the display field. The silicon-based micro-display organic light-emitting display panel can be used in, for example, virtual reality (VR) technology and augmented reality (AR) technology, and can achieve excellent display effects.

SUMMARY

At least one embodiment of the present disclosure provides a display substrate, the display substrate has a plurality of sub-pixels arranged in an array, and comprises a driving circuit substrate, a plurality of first electrodes, and a pixel definition layer. The driving circuit substrate comprises a plurality of pixel driving circuits for the plurality of sub-pixels and a protective insulating layer covering the plurality of pixel driving circuits, the protective insulating layer comprises a plurality of first vias exposing output terminals of the plurality of pixel driving circuits; the plurality of first electrodes are provided on the driving circuit substrate, and respectively electrically connected to the output terminals of the plurality of pixel driving circuits through the plurality of first vias, each of the plurality of first electrodes comprises a first sub-electrode layer and a second sub-electrode layer that are stacked, and comprises a transition layer between the first sub-electrode layer and the second sub-electrode layer, the transition layer comprises a first opening, and the first sub-electrode layer is electrically connected to the second sub-electrode layer through the first opening; the pixel definition layer is provided on a side of the plurality of first electrodes away from the driving circuit substrate, and comprises a plurality of sub-pixel openings respectively exposing the plurality of first electrodes, an orthographic projection of a first opening of a transition layer of at least one of the plurality of first electrodes on the driving circuit substrate is located inside an orthographic projection of the pixel definition layer on the driving circuit substrate.

For example, in the display substrate provided by at least one embodiment of the present disclosure, for a first electrode and a sub-pixel opening that are provided correspondingly, an entirety of the first electrode and the sub-pixel opening is symmetrical in a first direction, and is asymmetrical in a second direction, and the first direction is perpendicular to the second direction.

For example, in the display substrate provided by at least one embodiment of the present disclosure, an orthographic projection of at least one of the plurality of first vias on the driving circuit substrate is located inside the orthographic projection of the pixel definition layer on the driving circuit substrate.

For example, in the display substrate provided by at least one embodiment of the present disclosure, orthographic projections of the plurality of first vias on the driving circuit substrate are respectively located inside orthographic projections of a plurality of first openings on the driving circuit substrate.

For example, the display substrate provided by at least one embodiment of the present disclosure further comprises a plurality of first connection electrodes, the plurality of first connection electrodes are respectively in the plurality of first vias, so that first ends of the plurality of first connection electrodes are respectively electrically connected to the output terminals of the plurality of pixel driving circuits, and second ends of the plurality of first connection electrodes are respectively electrically connected to the plurality of first electrodes; and the second ends of the plurality of first connection electrode protrude from a surface of the protective insulating layer away from the driving circuit substrate.

For example, in the display substrate provided by at least one embodiment of the present disclosure, orthographic projections of the plurality of first connection electrodes on the driving circuit substrate are respectively located inside orthographic projections of a plurality of first openings on the driving circuit substrate.

For example, in the display substrate provided by at least one embodiment of the present disclosure, each of the plurality of sub-pixels comprises two first connection electrodes, and the two first connection electrodes are arranged in a first direction in a plane parallel to a surface of the driving circuit substrate.

For example, in the display substrate provided by at least one embodiment of the present disclosure, each of the plurality of first electrodes further comprises a third sub-electrode layer, and the third sub-electrode layer is on a side of the second sub-electrode layer close to the driving circuit substrate, and is connected to the first connection electrode; and the first sub-electrode layer is on a side of the second sub-electrode layer away from the driving circuit substrate.

For example, in the display substrate provided by at least one embodiment of the present disclosure, a material of the third sub-electrode layer comprises titanium, and a material of the first connection electrode comprises tungsten.

For example, in the display substrate provided by at least one embodiment of the present disclosure, a material of the second sub-electrode layer comprises aluminum or silver.

For example, in the display substrate provided by at least one embodiment of the present disclosure, a material of the first sub-electrode layer comprises transparent metal oxide.

For example, in the display substrate provided by at least one embodiment of the present disclosure, a material of the transition layer comprises silicon oxide, silicon nitride or silicon oxynitride.

For example, the display substrate provided by at least one embodiment of the present disclosure further comprises a plurality of second connection electrodes, the plurality of second connection electrodes are respectively provided in first openings of transition layers of the plurality of first electrodes, so that first ends of the plurality of second connection electrodes are respectively electrically connected to first sub-electrode layers of the plurality of first electrodes, and second ends of the plurality of second connection electrodes are respectively electrically connected to second sub-electrodes of the plurality of first electrodes.

For example, in the display substrate provided by at least one embodiment of the present disclosure, the first ends of the plurality of second connection electrodes respectively protrude from surfaces of the first sub-electrode layers of the plurality of first electrodes away from the driving circuit substrate.

For example, in the display substrate provided by at least one embodiment of the present disclosure, a thickness of the second connection electrode is greater than a thickness of the third sub-electrode layer.

For example, in the display substrate provided by at least one embodiment of the present disclosure, the second connection electrode covers the first opening and extends to a surface of the transition layer away from the driving circuit substrate.

For example, in the display substrate provided by at least one embodiment of the present disclosure, the pixel definition layer comprises a recessed structure at a position of the first opening.

For example, in the display substrate provided by at least one embodiment of the present disclosure, a material of the second connection electrode comprises titanium.

For example, in the display substrate provided by at least one embodiment of the present disclosure, a planar shape of the first opening is a V-shape.

For example, in the display substrate provided by at least one embodiment of the present disclosure, an opening of the V-shape faces a center of the first electrode.

For example, in the display substrate provided by at least one embodiment of the present disclosure, a planar shape of each of the plurality of first electrodes is a polygon, and a planar shape of each of the plurality of sub-pixel openings is a circle or an ellipse.

At least one embodiment of the present disclosure further provides a display device, the display device comprises the display substrate provided by the embodiments of the present disclosure.

BRIEF DESCRIPTION OF THE DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
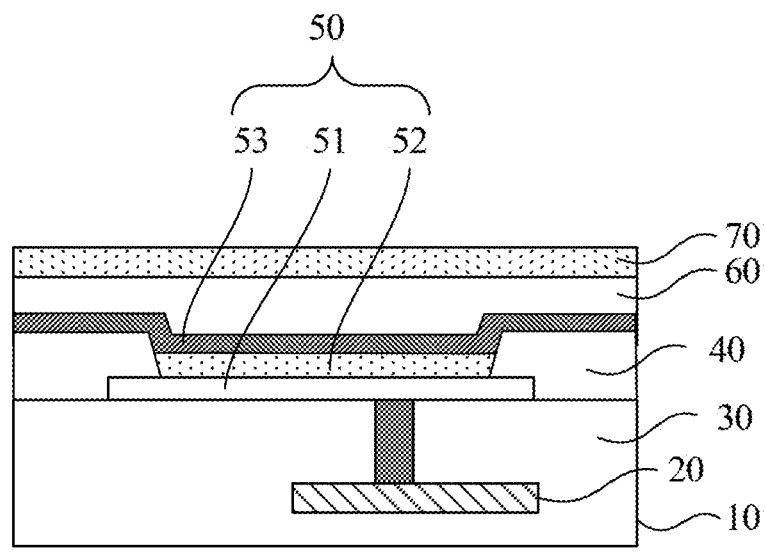
FIG. 1A is a schematic cross-sectional view of a silicon-based display substrate.

Micro OLED belongs to a silicon-based display device. Due to the excellent electrical properties and extremely small device size of silicon-based devices, it is beneficial to achieve high integration. For example, FIG. 1A shows a schematic cross-sectional view of a silicon-based display substrate. As shown in FIG. 1A, the silicon-based display substrate includes a driving circuit substrate 10, a plurality of light-emitting devices 50, and other structures.

For example, the silicon-based display substrate includes a plurality of sub-pixels arranged in an array, each sub-pixel includes a light-emitting device 50 and a driving circuit 20 provided in the driving circuit substrate 10, and the driving circuit 20 is configured to drive the light-emitting device 50 to emit light. The light-emitting device 50 includes an anode 51, a light-emitting material layer 52 and a cathode 53, and the anode 21 is connected to the driving circuit 20 through a via in the insulating layer 30. A pixel definition layer 40 is provided on the anode 51, the pixel definition layer 40 has a plurality of sub-pixel openings, and each sub-pixel opening exposes an anode 51 of one light-emitting device 50, thereby defining a light-emitting region of the light-emitting device 50.

Figure 1B:
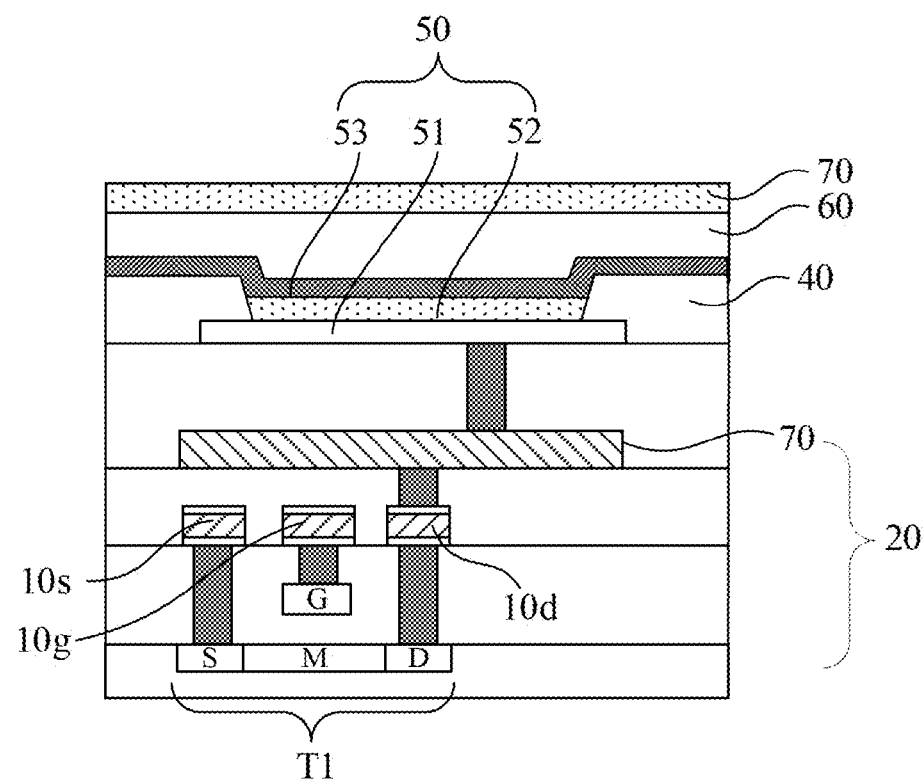
FIG. 1B is another schematic cross-sectional view of a silicon-based display substrate.

For example, FIG. 1B shows another schematic cross-sectional view of a silicon-based display substrate. In some embodiments, as shown in FIG. 1B, the driving circuit 20 includes structures such as a driving transistor T1 and a connection electrode 70. The driving transistor T1 includes a source electrode S, a drain electrode D and a semiconductor layer M, the semiconductor layer M is between the source electrode S and the drain electrode D, and one of the source electrode S and the drain electrode D (here, the drain electrode D) is electrically connected to the anode 51 through the connection electrode 70. The semiconductor layer M is, for example, a channel region formed between the source electrode S and the drain electrode D.

For example, as shown in FIG. 1B, the driving transistor T1 further includes a gate electrode G, and the gate electrode G, the source electrode S and the drain electrode D respectively correspond to three electrode connection portions. For example, the gate electrode G is electrically connected to a gate electrode connection portion 10g, the source electrode S is electrically connected to a source electrode connection portion 10s, and the drain electrode D is electrically connected to a drain electrode connection portion 10d. For example, the drain electrode D of the driving transistor T1 is electrically connected to the connection electrode 70 through the drain electrode connection portion 10d, and the gate electrode G and the source electrode S are electrically connected to a scan line and a power source line through the gate electrode connection portion 10g and the source electrode connection portion 10s, respectively. In the case where a turn-on signal is provided on the scan line, the driving transistor T1 is in a turn-on state, and an electrical signal provided by the power supply line can be transmitted to the anode 51 through the drain electrode D of the driving transistor T1, the drain electrode connection portion 102d and the connection electrode 70. Due to a voltage difference formed between the anode 51 and the cathode 53, an electric field is formed between the anode 51 and the cathode 53, and the light-emitting material layer 52 emits light under the action of the electric field.

For example, as shown in FIG. 1A and FIG. 1B, the silicon-based display substrate further includes an encapsulation layer 60 provided on the light-emitting device 50 and a color filter 70 provided on the encapsulation layer 60. The encapsulation layer 60 can encapsulate and protect the light-emitting device 50, and can also play a planarization role, so as to provide a flat surface. For example, the light-emitting device 50 of each sub-pixel may emit white light, and in this case, the color of the color filter 70 provided on the light-emitting device 50 of each sub-pixel is different, such as red, green, blue, etc., to achieve full color display; alternatively, the light-emitting device 50 of each sub-pixel can emit light of different colors, such as red, green and blue, etc., and in this case, the color of the color filter 70 provided on the light-emitting device 50 of each sub-pixel is the same as the color of the light emitted by the light-emitting device 50, so that the color purity of the light emitted by the light-emitting device 50 can be improved.

Figure 2:
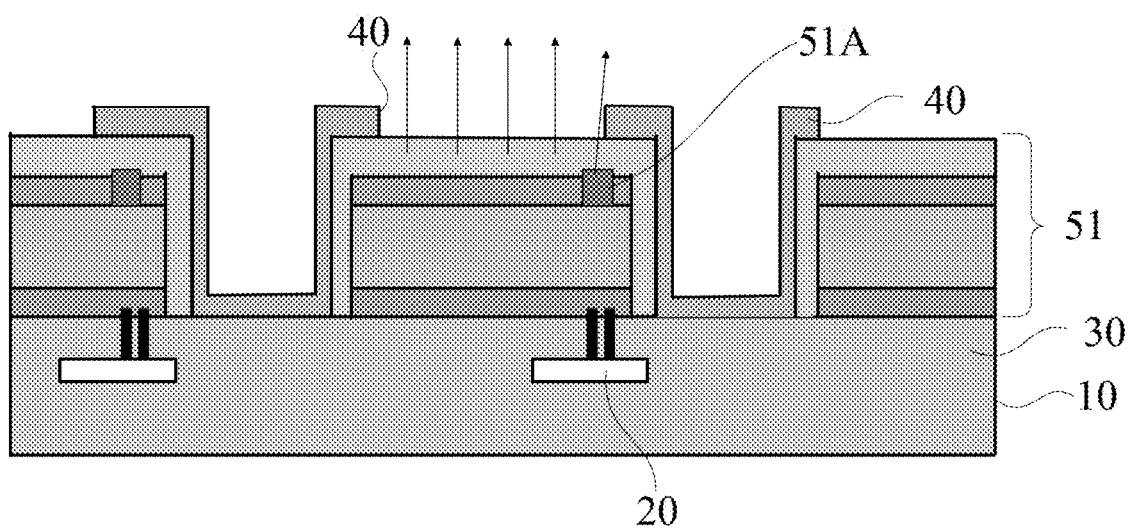
FIG. 2 is a schematic partial cross-sectional view of another silicon-based display substrate.

For example, in some embodiments of the present disclosure, because the anode 51 has a stacked multi-layer structure with a large thickness, the entirety of the anode 51 and the pixel definition layer 40 has the structure as shown in FIG. 2. As shown in FIG. 2, the anode 51 has a stacked multi-layer structure, and there is a connection structure 51A in the stacked multi-layer structure for connecting functional layers arranged at intervals in the stacked multi-layer structure. For example, a sub-pixel opening 41 of the pixel definition layer 40 is located in the middle part of the anode 51, so that the middle part of the anode 51 is formed as a light-emitting region of the light-emitting device 50. In this case, the entirety of the sub-pixel opening 41 and the anode 51 is centrosymmetric.

Figure 3:
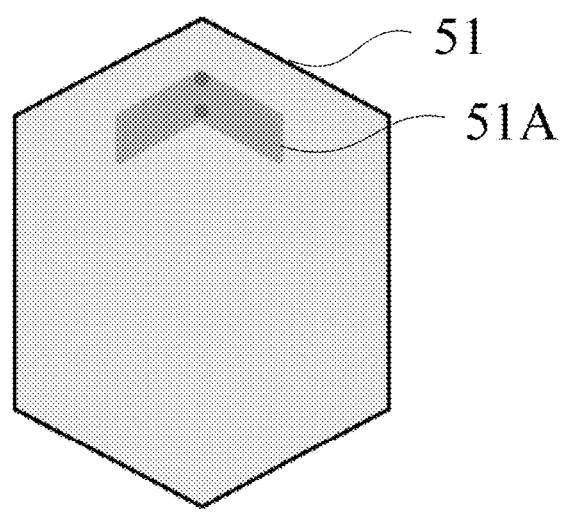
FIG. 3 is a schematic plan view of an anode of a sub-pixel in a silicon-based display substrate.
Figure 4:
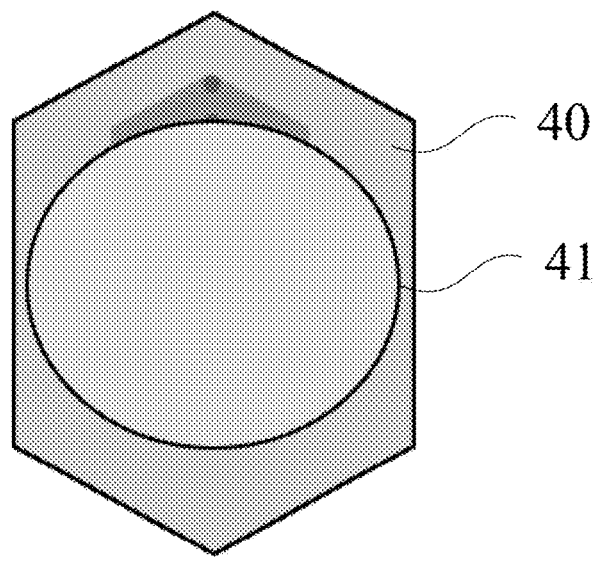
FIG. 4 is a schematic plan view of an anode and a sub-pixel opening of a sub-pixel in a silicon-based display substrate.

For example, FIG. 3 shows a schematic plan view of the anode 51 of a sub-pixel, and FIG. 4 shows a schematic plan view of the sub-pixel opening 41 and the anode 51 of a sub-pixel. As shown in FIG. 4, the sub-pixel opening 41 of the pixel definition layer 40 is located in the middle part of the anode 51, and the entirety of the sub-pixel opening 41 and the anode 51 is centrosymmetric. In this case, in combination with FIG. 2 and FIG. 4, when the anode 51 reflects the light emitted from a light-emitting material layer 52, the connection structure 51A will refract the light, and the refracted light can be emitted from the sub-pixel opening 41. In addition, because the propagation direction of the refracted light is different from the propagation direction of other emitting light, the light emitted from the sub-pixel will be uneven, thus affecting the display effect of the display substrate.

At least one embodiment of the present disclosure provides a display substrate, and the display substrate has a plurality of sub-pixels arranged in an array, and includes a driving circuit substrate, a plurality of first electrodes, and a pixel definition layer. The driving circuit substrate includes a plurality of pixel driving circuits for the plurality of sub-pixels and a protective insulating layer covering the plurality of pixel driving circuits, and the protective insulating layer includes a plurality of first vias exposing output terminals of the plurality of pixel driving circuits. The plurality of first electrodes are provided on the driving circuit substrate, and respectively electrically connected to the output terminals of the plurality of pixel driving circuits through the plurality of first vias. Each of the plurality of first electrodes includes a first sub-electrode layer and a second sub-electrode layer that are stacked, and includes a transition layer between the first sub-electrode layer and the second sub-electrode layer, the transition layer includes a first opening, and the first sub-electrode layer is electrically connected to the second sub-electrode layer through the first opening. The pixel definition layer is provided on a side of the plurality of first electrodes away from the driving circuit substrate, and includes a plurality of sub-pixel openings respectively exposing the plurality of first electrodes. An orthographic projection of a first opening of a transition layer of at least one of the plurality of first electrodes on the driving circuit substrate is located inside an orthographic projection of the pixel definition layer on the driving circuit substrate.

The light emitted from the plurality of sub-pixels of the above-mentioned display substrate provided by at least one embodiment of the present disclosure is more uniform, so that the display substrate has a better display effect.

Hereinafter, the display substrate provided by the embodiments of the present disclosure will be described in detail through several specific embodiments.

Figure 5:
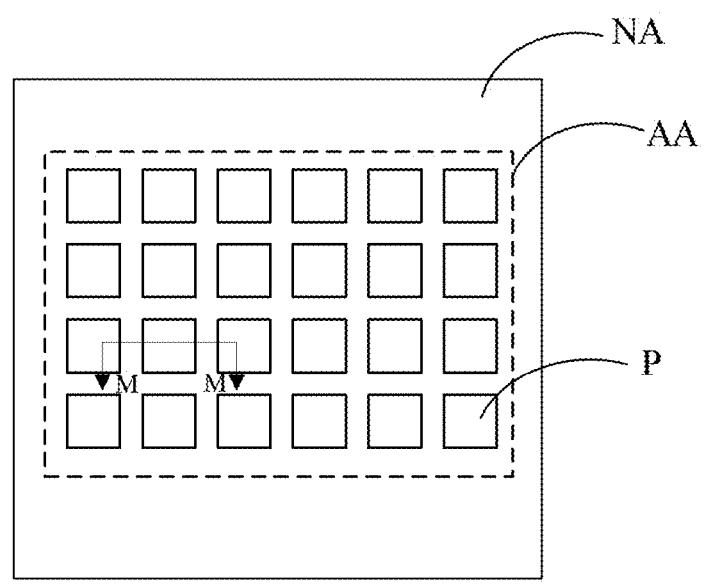
FIG. 5 is a schematic plan view of a display substrate provided by at least one embodiment of the present disclosure.

At least one embodiment of the present disclosure provides a display substrate. FIG. 5 shows a schematic plan view of the display substrate, and FIG. 6 shows a schematic partial cross-sectional view of the display substrate shown in FIG. 5 along a line M-M.

Figure 6:
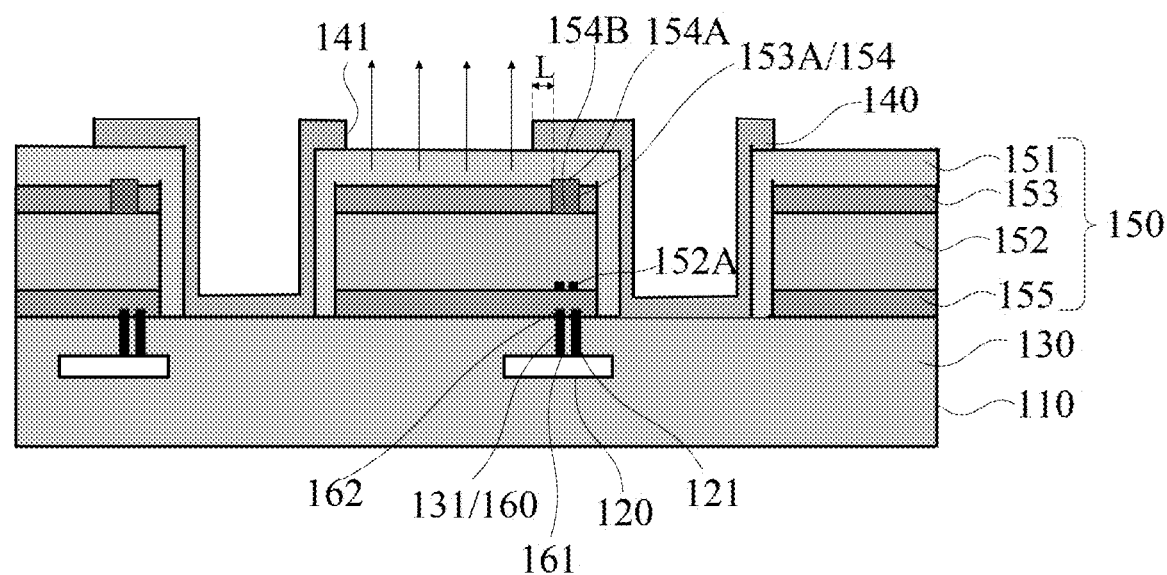
FIG. 6 is a schematic partial cross-sectional view of the display substrate shown in FIG. 5 along a line M-M.

As shown in FIG. 5 and FIG. 6, the display substrate has a display region AA and a peripheral region NA surrounding the display region AA, the display substrate further has a plurality of sub-pixels P arranged in an array, and the plurality of sub-pixels P are provided in the display region AA.

As shown in FIG. 6, the display substrate includes a driving circuit substrate 110, a plurality of first electrodes 150 and a pixel definition layer 140, and the driving circuit substrate 10 includes a plurality of pixel driving circuits 120 for the plurality of sub-pixels P and a protective insulating layer 130 covering the plurality of pixel driving circuits 120. The protective insulating layer 130 includes a plurality of first vias 131 exposing output terminals 121 of the plurality of pixel driving circuits 120, and the plurality of first electrodes 150 are provided on the driving circuit substrate 110, and respectively electrically connected to the output terminals 121 of the plurality of pixel driving circuits 120 through the plurality of first vias 131.

For example, as shown in FIG. 6, each first electrode 150 includes a first sub-electrode layer 151 and a second sub-electrode layer 152 that are stacked, and includes a transition layer 153 between the first sub-electrode layer 151 and the second sub-electrode layer 152, the transition layer 153 has a first opening 153A, and the first sub-electrode layer 151 is electrically connected to the second sub-electrode layer 152 through the first opening 153A.

For example, in some embodiments, each sub-pixel P includes a pixel driving circuit 120 and a light-emitting device, and the pixel driving circuit 120 is configured to drive the light-emitting device to emit light. The pixel driving circuit 120 may include structures such as a driving transistor and a connection electrode. For details, reference may be made to FIG. 1B and related descriptions, which will not be repeated here. The light-emitting device may include an anode, a cathode, and a light-emitting material layer between the anode and the cathode. For example, the first electrode 150 may be used as the anode of the light-emitting device. In this case, the second sub-electrode layer 152 may be used as a reflective electrode for reflecting the light emitted by the light-emitting material layer formed thereon, so as to improve the light-extraction rate of the light-emitting device.

For example, the material of the second sub-electrode layer 152 may include a metal material or an alloy material with high reflectivity such as aluminum, silver, and the like. For example, the first sub-electrode layer 151 has higher work function and light transmittance, and the material of the first sub-electrode layer 151 may include transparent metal oxides, such as indium tin oxide (ITO), indium zinc oxide (IZO), gallium zinc oxide (GZO), and the like. In this way, the light reflected by the second sub-electrode layer 152 can pass through the first sub-electrode layer 151 with almost no loss to improve the light-extraction efficiency and light-extraction brightness of the light-emitting device.

In the embodiments of the present disclosure, the transition layer 153 can improve the adhesive force between the first sub-electrode layer 151 and the second sub-electrode layer 152 to avoid easy separation of the first sub-electrode layer 151 and the second sub-electrode layer 152 caused by the direct connection of the first sub-electrode layer 151 and the second sub-electrode layer 152, thereby improving the structural stability of the first electrode. For example, in some examples, the material of the transition layer 153 may include an insulating material, for example, an inorganic insulating material such as silicon oxide, silicon nitride, or silicon oxynitride.

For example, the pixel definition layer 140 is provided on the side of the plurality of first electrodes 150 away from the driving circuit substrate 110, and includes a plurality of sub-pixel openings 141 respectively exposing the plurality of first electrodes 150. For example, the pixel definition layer 140 may be formed by an organic insulating material such as polyimide.

For example, the orthographic projection of the first opening 153A of the transition layer 153 of at least one of the plurality of first electrodes 150 on the driving circuit substrate 10 is located inside the orthographic projection of the pixel definition layer 140 on the driving circuit substrate 110. For example, the orthographic projection of the first opening 153A of the transition layer 153 of each first electrode 150 on the driving circuit substrate 10 is located inside(within) the orthographic projection of the pixel definition layer 140 on the driving circuit substrate 110.

Therefore, the pixel definition layer 140 can block the first opening 153A to prevent the light emitted by the light-emitting material layer and reflected by the second sub-electrode layer 152 from being refracted by the material filled in the first opening 153A and being emitted from the sub-pixel opening 141, which affects the light-extraction uniformity of the light-emitting device. For example, as shown in FIG. 6, through the above design, the light emitted by the light-emitting material layer and reflected by the second sub-electrode layer 152 can be uniformly emitted from the sub-pixel opening 141, thereby improving the light-extraction uniformity of the display device, thereby improving the light-extraction uniformity of the entire display panel, and improving the display effect of the display panel.

Figure 7:
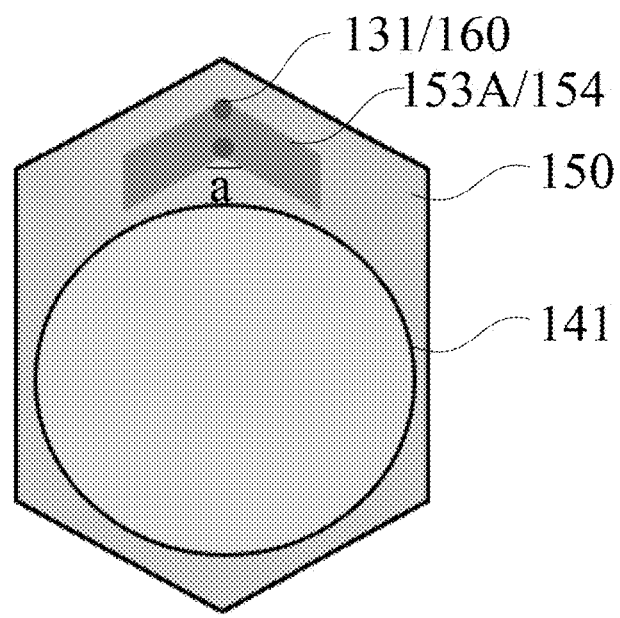
FIG. 7 is a schematic plan view of a first electrode and a sub-pixel opening of a sub-pixel in a display substrate provided by at least one embodiment of the present disclosure.

For example, FIG. 7 shows a schematic plan view of a first electrode and a sub-pixel opening of a sub-pixel. As shown in FIG. 7, for the first electrode 150 and the sub-pixel opening 141 correspondingly provided in the same sub-pixel, the entirety of the first electrode 150 and the sub-pixel opening 141 is symmetrical in a first direction (e.g., the horizontal direction in FIG. 7), and is asymmetrical in a second direction (e.g., the vertical direction in FIG. 7), and the first direction is perpendicular to the second direction. Therefore, the sub-pixel opening 141 does not expose the first opening 153A, that is, the pixel definition layer 140 can sufficiently block the first opening 153A.

For example, in some embodiments, the orthographic projection of at least one of the plurality of first vias 131 on the driving circuit substrate 110 is located inside the orthographic projection of the pixel definition layer 140 on the driving circuit substrate 110. For example, the orthographic projection of each first via 131 on the driving circuit substrate 110 is located inside the orthographic projection of the pixel definition layer 140 on the driving circuit substrate 110.

For example, in some embodiments, as shown in FIG. 6, the display substrate further includes a plurality of first connection electrodes 160, and the plurality of first connection electrodes 160 are respectively provided in the plurality of first vias 131, so that first ends 161 of the plurality of first connection electrodes 160 are respectively electrically connected to the output terminals 121 of the plurality of pixel driving circuits 120, and second ends 162 of the plurality of first connection electrodes 160 are respectively connected to the plurality of first electrodes 150. For example, the second end 162 of the first connection electrode 160 protrudes from the surface of the protective insulating layer 130 away from the driving circuit substrate 110 (i.e., the upper surface of the protective insulating layer 130 in the figure), thereby facilitating the stable connection between the first connection electrode 160 and the first electrode 150.

Because the second end 162 of the first connection electrode 160 protrudes from the surface of the protective insulating layer 130 away from the driving circuit substrate 110, the first electrode 150 formed thereon also has a corresponding shape change. For example, the surface of the second sub-electrode layer 152 of the first electrode 150 close to the driving circuit substrate 110 has a recessed portion 152A, so when the recessed portion 152A reflects the light emitted by the light-emitting material layer, the phenomenon of uneven reflected light may also occur, which affects the display effect of the display substrate.

In the embodiments of the present disclosure, the pixel definition layer 140 can further block the first via 131, that is, block the first connection electrode 160, so as to block the light reflected by the recessed portion of the second sub-electrode layer 152 and avoid the phenomenon that the light reflected by the second sub-electrode layer 152 is uneven due to the protrusion of the first connection electrode 160.

For example, in some embodiments, the orthographic projections of the plurality of first connection electrodes 160 on the driving circuit substrate 110 are respectively located inside the orthographic projections of the plurality of first openings 153A on the driving circuit substrate 110. Thus, the structures in the first electrode 150 that affect the light-extraction uniformity of the light-emitting device are concentrated in substantially the same position, thereby reducing the space occupied by the structures affecting the light-extraction uniformity of the light-emitting device in the first electrode 150, so as to ensure that the sub-pixel opening 141 can also have a sufficient size to form a light-emitting region of the light-emitting device.

For example, in some embodiments, each first electrode 150 may correspond to one or more first vias 131, and thus also has one or more first connection electrodes 160. Two first vias 131 and two first connection electrodes 160 are shown as an example in FIG. 6 and FIG. 7. As shown in FIG. 6 and FIG. 7, the orthographic projections of first vias 131 on the driving circuit substrate 110 are respectively located inside the orthographic projection of the plurality of first openings 153A on the driving circuit substrate 110, and in this case, the orthographic projections of the first connection electrodes 160 in the first vias 131 on the driving circuit substrate 110 are also respectively located inside the orthographic projections of the plurality of first openings 153A on the driving circuit substrate 110. Thus, the pixel definition layer 140 can sufficiently block the first via 131 and the first connection electrode 160 at substantially the same position.

For example, in a plane parallel to a surface of the driving circuit substrate 110, as shown in FIG. 7, the two first connection electrodes 160 are arranged in the first direction (the vertical direction in the figure). For example, the first direction is a column direction or a row direction of the sub-pixels in the display substrate.

For example, in some embodiments, as shown in FIG. 6, the minimum distance L between the sub-pixel opening 141 and the first opening 153A may range from 0.1 μm to 0.3 μm, such as 0.15 μm, 0.2 μm, 0.25 μm, or the like, to ensure that uneven light is sufficiently blocked to prevent the light refracted by a large angle from passing through the sub-pixel opening 141.

For example, in some embodiments, as shown in FIG. 6, each first electrode 150 may further include a third sub-electrode layer 155, the third sub-electrode layer 155 is provided on the side of the second sub-electrode layer 152 close to the driving circuit substrate 110 and is connected to the first connection electrode 160, and the first sub-electrode layer 151 is provided on the side of the second sub-electrode layer 152 away from the driving circuit substrate 110.

For example, the third sub-electrode 155 can be used as a connection electrode for realizing an effective connection between the first electrode 150 and the first connection electrode 160, and can reduce the contact resistance between the first electrode 150 and the first connection electrode 160. For example, in some examples, the material of the third sub-electrode 155 includes titanium, and the material of the first connection electrode 160 includes tungsten. The contact resistance between titanium and tungsten is small, so using the above materials to form the third sub-electrode 155 and the first connection electrode 160 can improve the electrical connection effect and signal transmission effect between the first electrode 150 and the pixel driving circuit 120 as a whole.

For example, in some embodiments, as shown in FIG. 6, the display substrate may further include a plurality of second connection electrodes 154, and the plurality of second connection electrodes 154 are respectively provided in first openings 153A of transition layers 153 of the plurality of first electrodes 150, so that first ends 154A of the plurality of second connection electrodes 154 are respectively connected to first sub-electrode layers 151 of the plurality of first electrodes, and second ends 154B of the plurality of second connection electrodes 154 are respectively electrically connected to second sub-electrodes 152 of the plurality of first electrodes. Thus, the first sub-electrode layer 151 is electrically connected to the second sub-electrode 152 through the second connection electrode 154.

For example, as shown in FIG. 6, the first end 154A of the second connection electrode 154 protrudes from the surface of the first sub-electrode layer 151 away from the driving circuit substrate 110, thereby facilitating the stable connection between the second connection electrode 154 and the first sub-electrode layer 151.

For example, in some embodiments, the material of the second connection electrode 154 may include a metal material such as titanium and the like. In this case, the contact resistance between the second connection electrode 154 and the first sub-electrode layer 151 and the contact resistance between the second connection electrode 154 and the second sub-electrode 152 are small, which is beneficial to improve the electrical connection effect and the signal transmission effect.

For example, in some embodiments, as shown in FIG. 7, the planar shape of the first opening 153A may be a V-shape. For example, an opening of the V-shape faces the center of the first electrode 150. In this way, the first opening 153A can avoid a space for arranging the sub-pixel opening 141 while maintaining a large opening area.

For example, in some embodiments, as shown in FIG. 7, the planar shape of each of the plurality of first electrodes 150 may be a polygon, such as a pentagon or a hexagon (as shown in the figure), etc., and the planar shape of each of the plurality of sub-pixel openings 141 is a circle (as shown in the figure) or an ellipse, etc. For example, in some examples, as shown in FIG. 7, the opening angle a of the V-shape may range from 110 degrees to 160 degrees, such as 120 degrees, 150 degrees, or the like, so that the first opening 153A can fully occupy the peripheral space of the sub-pixel opening 141, thereby improving the space utilization.

Figure 8:
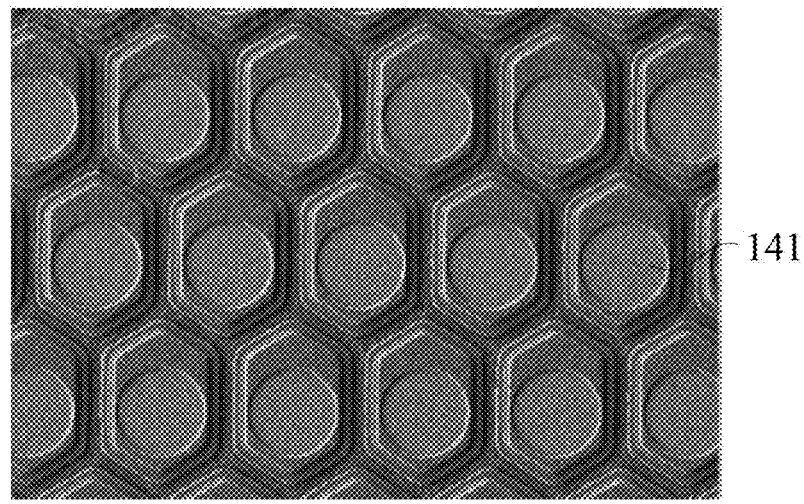
FIG. 8 is a scanning electron microscope view of a display substrate provided by at least one embodiment of the present disclosure.
Figure 9:
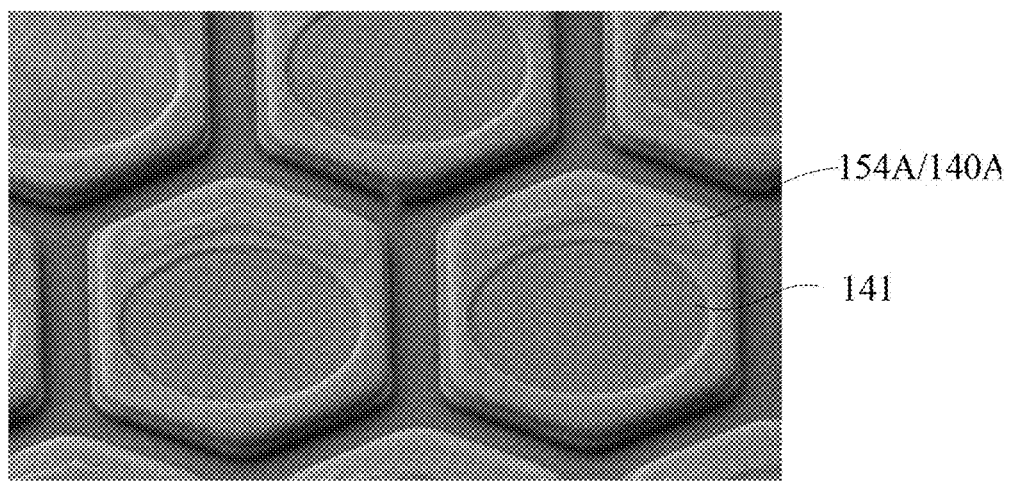
FIG. 9 is another scanning electron microscope view of a display substrate provided by at least one embodiment of the present disclosure.

For example, FIG. 8 and FIG. 9 respectively show scanning electron microscope views of the plurality of first electrodes 150 and the plurality of sub-pixel openings 141. As shown in FIG. 8 and FIG. 9, in this example, the plurality of first electrodes 150 are hexagonal, and two adjacent rows of the first electrodes 150 are arranged in a staggered manner, so that shapes of the two adjacent rows of the first electrodes 150 are complementary to make full use of the layout space in order to have a greater number of the first electrodes 150 in the same layout space, thereby achieving a greater resolution of the formed display substrate.

For example, as shown in FIG. 9, because the first end 154A of the second connection electrode 154 protrudes from the surface of the first sub-electrode layer 151 away from the driving circuit substrate 110, the pixel definition layer 140 blocks the second connection electrode 154, and in this case, the surface of the pixel definition layer 140 also has a protruding portion 140A correspondingly, but since the sub-pixel opening 141 does not expose the second connection electrode 154, the light emitted by the light-emitting device and from the sub-pixel opening 141 can still have a high uniformity.

For example, in some embodiments, the thickness of the second connection electrode 154 is greater than the thickness of the third sub-electrode layer 155.

For example, in some examples, the thickness of the third sub-electrode layer 155 may range from 5 nm to 15 nm, such as 10 nm, the thickness of the second sub-electrode layer 152 may range from 90 nm to 110 nm, such as 100 nm, the thickness of the transition layer 153 may range from 25 nm to 35 nm, such as 30 nm, and the thickness of the second connection electrode 154 may range from 15 nm to 30 nm, such as 20 nm. In this case, the thickness of the second connection electrode 154 is greater than the thickness of the transition layer 153, so the first electrode 150 is embodied in a protruding form at the position of the second connection electrode 154.

Figure 11:
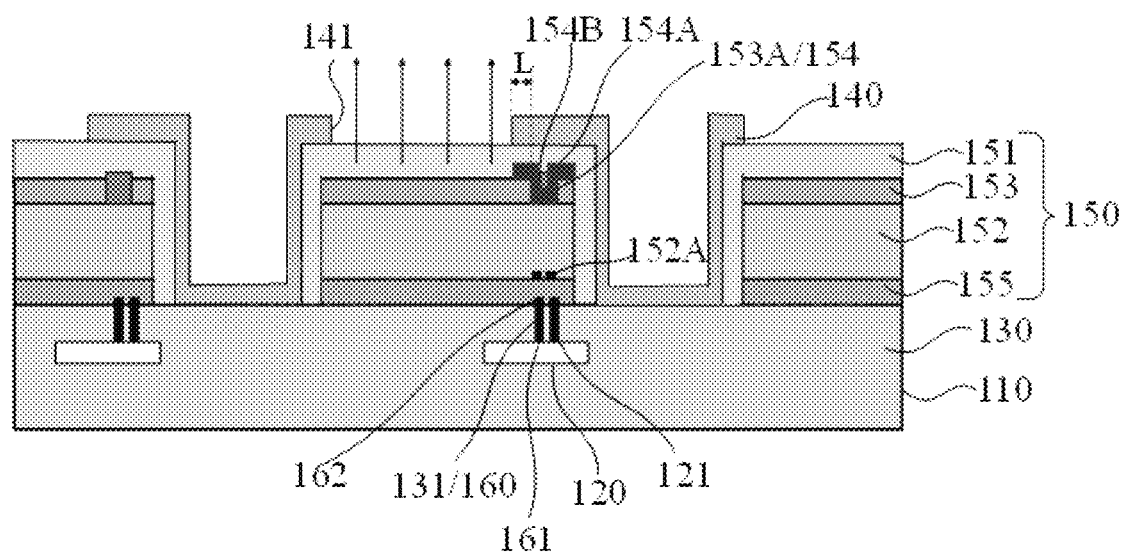
FIG. 11 is further another schematic cross-sectional view of the display substrate shown in FIG. 5 along the line M-M.

For example, in other examples, as shown in FIG. 11, the second connection electrode 154 covers the first opening 153A and extends to the surface of the transition layer 153 away from the driving circuit substrate 110. For example, the pixel definition layer 140 includes a recessed structure at the position of the first opening 153A.

Figure 12:
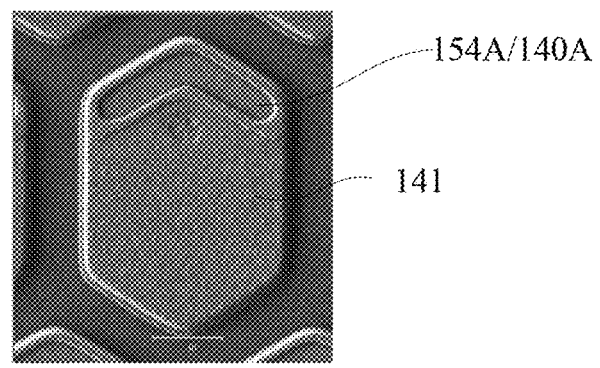
FIG. 12 is further another scanning electron microscope view of a display substrate provided by at least one embodiment of the present disclosure.

For example, FIG. 12 shows a scanning electron microscope view of the display substrate shown in FIG. 11. As shown in FIG. 12, the first end 154A of the second connection electrode 154 is recessed with respect to the surface of the first sub-electrode layer 151 away from the driving circuit substrate 110, thereby forming the form of a recess.

For example, in the example shown in FIG. 11 and FIG. 12, the thickness of the third sub-electrode layer 155 may range from 5 nm to 15 nm, such as 10 nm, the thickness of the second sub-electrode layer 152 may range from 90 nm to 110 nm, such as 100 nm, and the thickness of the transition layer 153 may range from 25 nm to 35 nm, such as 30 nm, and the thickness of the second connection electrode 154 may range from 5 nm to 15 nm, such as 10 nm. In this case, the thickness of the second connection electrode 154 is smaller than the thickness of the transition layer 153, so the first electrode 150 is embodied in the form of a recess at the position of the second connection electrode 154.

Figure 13A:
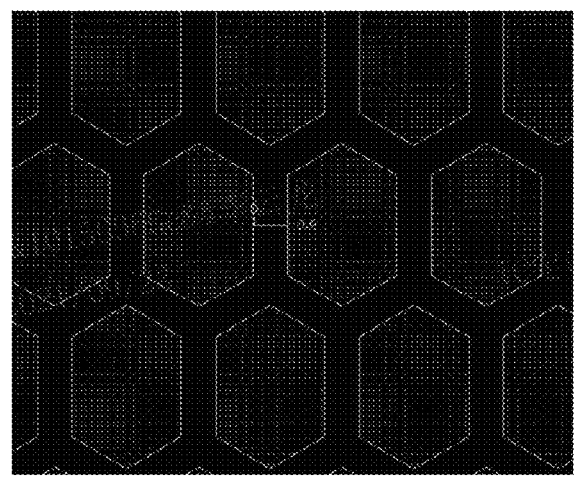
FIG. 13A to FIG. 13D are schematic plan views of a plurality of functional layers of a first electrode in a display substrate provided by at least one embodiment of the present disclosure.
Figure 13B:
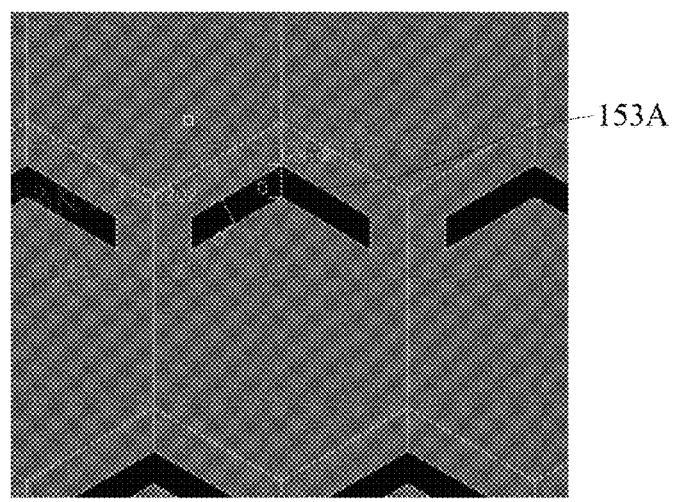
Figure 13C:
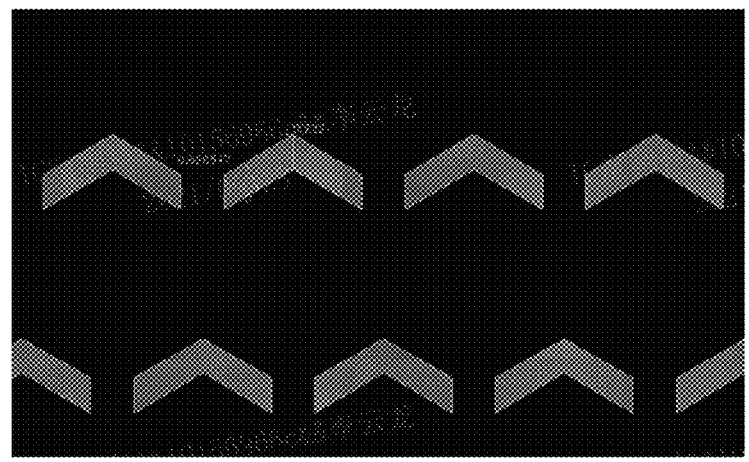
Figure 13D:
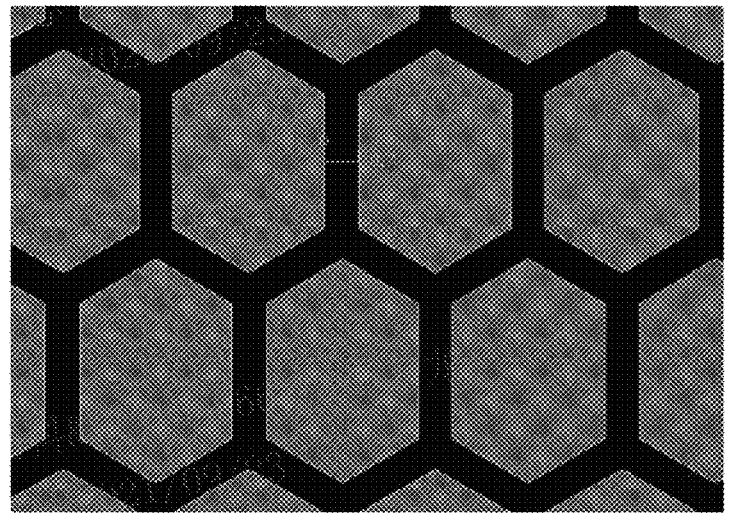
Figure 13E:
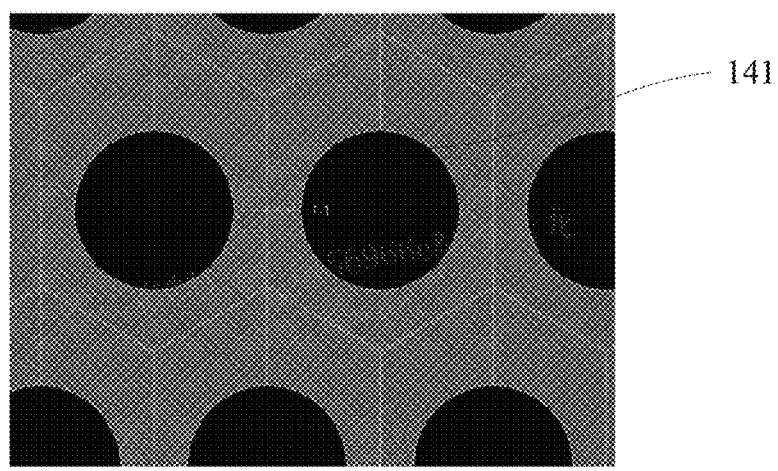
FIG. 13E is a schematic plan view of a pixel definition layer in a display substrate provided by at least one embodiment of the present disclosure.

For example, FIG. 13A-FIG. 13D show schematic plan views of a plurality of functional layers of the first electrode, and FIG. 13E shows a schematic plan view of a pixel definition layer. For example, FIG. 13A shows a schematic plan view of the second sub-electrode layer and the third sub-electrode layer. For example, as shown in FIG. 13A, the planar shapes of the second sub-electrode layer 152 and the third sub-electrode layer 155 are the same, and both are hexagon. For example, the distance between the second sub-electrode layers 152 (or the third sub-electrode layers 155) of adjacent sub-pixels is 0.9 µm. For example, FIG. 13B shows a schematic plan view of the transition layer. For example, as shown in FIG. 13B, the transition layer 153 has a first opening 153A, and the planar shape of the first opening 153A is a V-shape. For example, the width of the first opening 153A at a straight portion of the V-shape is about 0.4252 µm, and the width of the first opening 153A at the top of the V-shape is about 0.402 µm. For example, FIG. 13C shows a schematic plan view of the second connection electrode. For example, as shown in FIG. 13C, the planar shape of the second connection electrode 154 is a V-shape correspondingly. For example, the width of the second connection electrode 154 at a straight portion of the V-shape is about 0.6265 µm, and the width of the second connection electrode 154 at the top of the V-shape is about 0.722 µm. In this case, the second connection electrode 154 covers the first opening 153A and extends to the surface of the transition layer 153 away from the driving circuit substrate 110. For example, FIG. 13D shows a schematic plan view of the first sub-electrode layer. For example, as shown in FIG. 13D, the planar shape of the first sub-electrode layer 151 is a hexagon. For example, the distance between the first sub-electrode layers 151 of adjacent sub-pixels is 0.7 µm.

For example, FIG. 13E shows a schematic plan view of the pixel definition layer. For example, as shown in FIG. 13E, the pixel definition layer 140 has a sub-pixel opening 141, and the shape of the sub-pixel opening 141 is a circle. For example, the distance between the sub-pixel openings 141 of adjacent sub-pixels is 1.1 µm.

Figure 10:
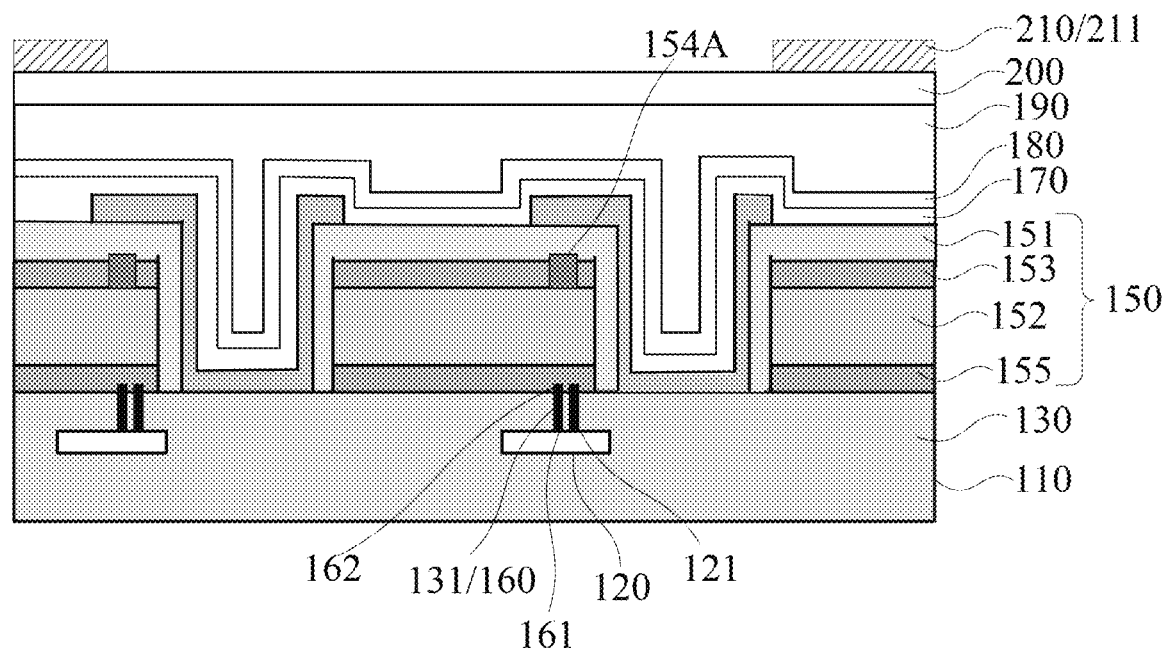
FIG. 10 is another schematic cross-sectional view of the display substrate shown in FIG. 5 along the line M-M.

For example, FIG. 10 shows another schematic cross-sectional view of the display substrate in FIG. 5 along the line M-M. As shown in FIG. 10, structures such as a light-emitting material layer 170 and a second electrode layer 180 are also formed on the first electrode 150. The first electrode 150, the light-emitting material layer 170 and the second electrode layer 180 together form a light-emitting device, and the second electrode layer can be used as a cathode of the light-emitting device, for example, the light-emitting material layer 170 may adopt a metal material such as lithium, aluminum, magnesium, silver, or the like, or an alloy material thereof. The light-emitting material layer 170 may include a light-emitting layer and an auxiliary light-emitting layer that assists the light-emitting layer to emit light. For example, the auxiliary light-emitting layer may be one or more of a hole injection layer, a hole transport layer, an electron blocking layer, an electron injection layer, an electron transport layer and a hole blocking layer, and the embodiments of the present disclosure do not limit the specific form of the light-emitting material layer 170.

For example, an encapsulation layer 190 may also be formed on the second electrode layer. The encapsulation layer 190 may be a composite encapsulation layer in which an organic encapsulation layer and an inorganic encapsulation layer are stacked. The organic encapsulation layer may be made of an organic material such as polyimide or resin, and the inorganic encapsulation layer may be made of an inorganic material such as silicon oxide, silicon nitride or silicon oxynitride.

For example, in some embodiments, other functional layers such as a color filter layer 200 and a lens layer 210 may also be formed on the encapsulation layer 190. For example, the color filter layer 200 may include a plurality of color filters, each of the plurality of color filters is provided corresponding to the sub-pixel opening 141 to filter light emitted from the sub-pixel opening 141. For example, the lens layer 210 may include a plurality of lenses 211, and each lens 211 may be provided corresponding to the sub-pixel opening 141. For example, the lens 211 may be a convex lens, and the planar shape of the convex lens is a circle or a square. In this case, the planar shape (for example, a circle) of the sub-pixel opening 141 can be matched with the lens 211 to improve the brightness of the light emitted by the sub-pixels.

For example, other structures such as an adhesive layer and a cover plate may also be provided on the lens layer 210. For details, reference may be made to the related art. The embodiments of the present disclosure do not specifically limit other structures of the display substrate.

For example, in the embodiments of the present disclosure, the driving circuit substrate 10 may be formed by using a silicon-based substrate and semiconductor manufacturing technology, for example, it can be manufactured in a wafer factory. Therefore, the display substrate provided by the embodiment of the present disclosure can be formed by directly forming the first electrode, the light-emitting material layer, the second electrode layer, the encapsulation layer and other structures on the driving circuit substrate 10, and the manufacturing process is simple. In addition, because the manufacturing process of the silicon-based driving circuit substrate is mature and the performance is stable, it is suitable for manufacturing a highly integrated micro display device. Therefore, the display substrate provided by the embodiments of the present disclosure may be a silicon-based micro organic light-emitting diode display substrate.

At least one embodiment of the present disclosure further provides a display device, the display device includes the display substrate provided by the embodiments of the present disclosure. For example, the display device may be any product or component with a display function, such as a mobile phone, a tablet computer, a television, a monitor, a notebook computer, a digital photo frame, a navigator, a VR display device, or the like.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having a plurality of sub-pixels arranged in an array, and comprising:
    a driving circuit substrate, comprising a plurality of pixel driving circuits for the plurality of sub-pixels and a protective insulating layer covering the plurality of pixel driving circuits, wherein the protective insulating layer comprises a plurality of first vias exposing output terminals of the plurality of pixel driving circuits;
    a plurality of first electrodes, provided on the driving circuit substrate, and respectively electrically connected to the output terminals of the plurality of pixel driving circuits through the plurality of first vias, wherein each of the plurality of first electrodes comprises a first sub-electrode layer and a second sub-electrode layer that are stacked, and comprises a transition layer between the first sub-electrode layer and the second sub-electrode layer, the transition layer comprises a first opening, and the first sub-electrode layer is electrically connected to the second sub-electrode layer through the first opening; and
    a pixel definition layer, provided on a side of the plurality of first electrodes away from the driving circuit substrate, and comprising a plurality of sub-pixel openings respectively exposing the plurality of first electrodes,
    wherein an orthographic projection of a first opening of a transition layer of at least one of the plurality of first electrodes on the driving circuit substrate is located inside an orthographic projection of the pixel definition layer on the driving circuit substrate;
    an orthographic projection of the first sub-electrode layer on the driving circuit substrate at least partially overlaps with an orthographic projection of the second sub-electrode layer on the driving circuit substrate, and orthographic projections of the plurality of sub-pixel openings on the driving circuit substrate are respectively located inside orthographic projections of first sub-electrode layers of the plurality of first electrodes on the driving circuit substrate, and respectively located inside orthographic projections of second sub-electrode layers of the plurality of first electrodes on the driving circuit substrate.

2. The display substrate according to claim 1, wherein for a first electrode and a sub-pixel opening that are provided correspondingly, an entirety of the first electrode and the sub-pixel opening is symmetrical in a first direction, and is asymmetrical in a second direction, and the first direction is perpendicular to the second direction.

3. The display substrate according to claim 1, wherein an orthographic projection of at least one of the plurality of first vias on the driving circuit substrate is located inside the orthographic projection of the pixel definition layer on the driving circuit substrate.

4. The display substrate according to claim 1, wherein orthographic projections of the plurality of first vias on the driving circuit substrate are respectively located inside orthographic projections of a plurality of first openings on the driving circuit substrate.

5. The display substrate according to claim 1, further comprising a plurality of first connection electrodes,
    wherein the plurality of first connection electrodes are respectively in the plurality of first vias, so that first ends of the plurality of first connection electrodes are respectively electrically connected to the output terminals of the plurality of pixel driving circuits, and second ends of the plurality of first connection electrodes are respectively electrically connected to the plurality of first electrodes; and
    the second ends of the plurality of first connection electrodes protrude from a surface of the protective insulating layer away from the driving circuit substrate.

6. The display substrate according to claim 5, wherein orthographic projections of the plurality of first connection electrodes on the driving circuit substrate are respectively located inside orthographic projections of a plurality of first openings on the driving circuit substrate.

7. The display substrate according to claim 6, wherein each of the plurality of sub-pixels comprises two first connection electrodes, and the two first connection electrodes are arranged in a first direction in a plane parallel to a surface of the driving circuit substrate.

8. The display substrate according to claim 1, wherein each of the plurality of first electrodes further comprises a third sub-electrode layer, and the third sub-electrode layer is on a side of the second sub-electrode layer close to the driving circuit substrate, and is connected to the first connection electrode; and the first sub-electrode layer is on a side of the second sub-electrode layer away from the driving circuit substrate.

9. The display substrate according to claim 8, wherein a material of the third sub-electrode layer comprises titanium, and a material of the first connection electrode comprises tungsten.

10. The display substrate according to claim 8, further comprising a plurality of second connection electrodes, wherein the plurality of second connection electrodes are respectively provided in first openings of transition layers of the plurality of first electrodes, so that first ends of the plurality of second connection electrodes are respectively electrically connected to first sub-electrode layers of the plurality of first electrodes, and second ends of the plurality of second connection electrodes are respectively electrically connected to second sub-electrodes of the plurality of first electrodes.

11. The display substrate according to claim 10, wherein the first ends of the plurality of second connection electrodes respectively protrude from surfaces of the first sub-electrode layers of the plurality of first electrodes away from the driving circuit substrate.

12. The display substrate according to claim 10, wherein a thickness of the second connection electrode is greater than a thickness of the third sub-electrode layer.

13. The display substrate according to claim 10, wherein the second connection electrode covers the first opening and extends to a surface of the transition layer away from the driving circuit substrate.

14. The display substrate according to claim 13, wherein the pixel definition layer comprises a recessed structure at a position of the first opening.

15. The display substrate according to claim 10, wherein a material of the second connection electrode comprises titanium.

16. The display substrate according to claim 1, wherein a material of the second sub-electrode layer comprises aluminum or silver;

a material of the first sub-electrode layer comprises transparent metal oxide; and a material of the transition layer comprises silicon oxide, silicon nitride or silicon oxynitride.

17. The display substrate according to claim 1, wherein a planar shape of the first opening is a V-shape.

18. The display substrate according to claim 17, wherein an opening of the V-shape faces a center of the first electrode.

19. The display substrate according to claim 1, wherein a planar shape of each of the plurality of first electrodes is a polygon, and a planar shape of each of the plurality of sub-pixel openings is a circle or an ellipse.

20. A display device, comprising the display substrate according to claim 1.

* * * * *